United States Patent [19]

Waller, Jr.

[11] Patent Number: 4,696,044
[45] Date of Patent: Sep. 22, 1987

[54] DYNAMIC NOISE REDUCTION WITH LOGARITHMIC CONTROL

[76] Inventor: James K. Waller, Jr., 9901 Allen Rd., Clarkston, Mich. 48016

[21] Appl. No.: 912,525

[22] Filed: Sep. 29, 1986

[51] Int. Cl.$^4$ ............................................. H03G 7/00
[52] U.S. Cl. ..................................... 381/106; 381/98; 333/14
[58] Field of Search ................. 455/239, 240, 241, 72; 381/106, 13, 98; 333/14

[56] References Cited

U.S. PATENT DOCUMENTS

| | | | |
|---|---|---|---|
| 2,967,992 | 1/1961 | Scholten | 381/106 |
| 3,361,975 | 2/1968 | Rorden et al. | 455/239 |
| 3,631,365 | 12/1971 | Dolby | 381/106 |
| 3,775,705 | 11/1973 | Dolby | 381/106 |
| 3,789,143 | 1/1974 | Blackmer | 381/106 |
| 3,978,409 | 8/1976 | Dolby et al. | 333/14 |
| 4,136,314 | 1/1979 | Blackmer et al. | 333/14 |
| 4,263,560 | 4/1981 | Ricker | 455/239 |
| 4,322,579 | 3/1982 | Kleis et al. | 381/106 |
| 4,538,297 | 8/1985 | Waller, Jr. | 381/106 |

*Primary Examiner*—Forester W. Isen
*Attorney, Agent, or Firm*—Frank J. Catalano

[57] ABSTRACT

DC signals for controlling variably controlled filters for input audio frequency signals are derived by filtering the input signal to reduce its level in response to variations in intensity and frequency and then logarithmically compressing the filtered signal. An absolute value signal proportionately corresponding to the compressed signal is then derived and combined with an externally generated reference signal of variably selectable level. The combined signal is then converted to a dc variable filter control signal which is blocked when its level falls below the level corresponding to the preselected reference signal level.

7 Claims, 4 Drawing Figures

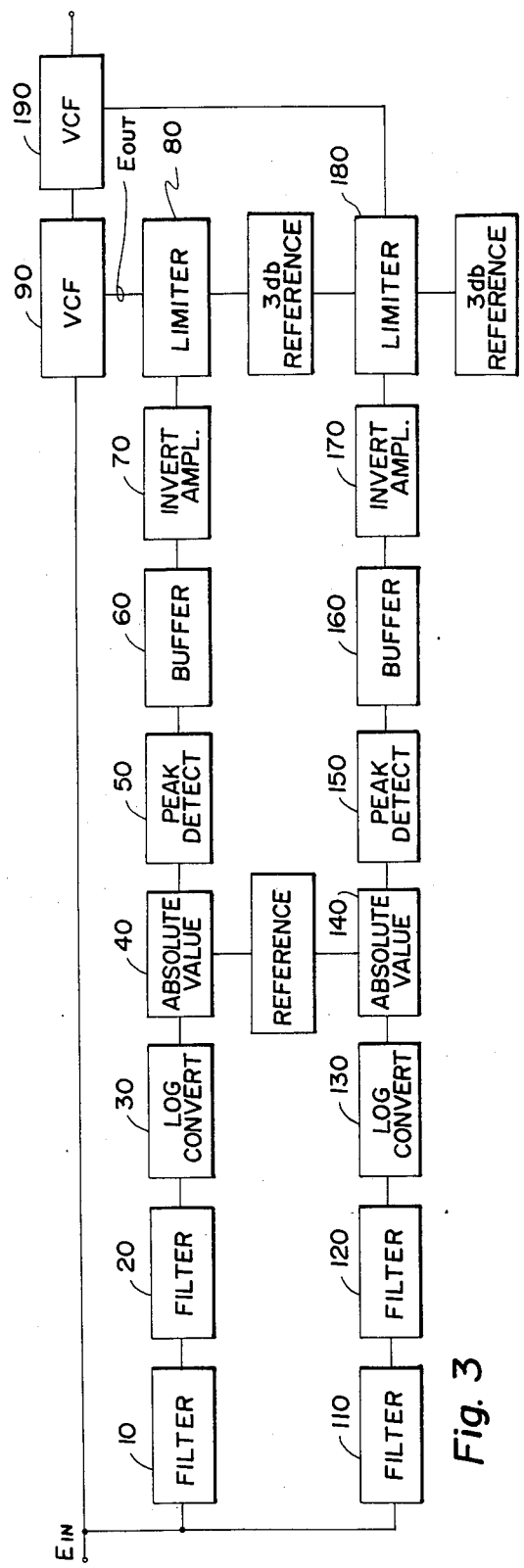
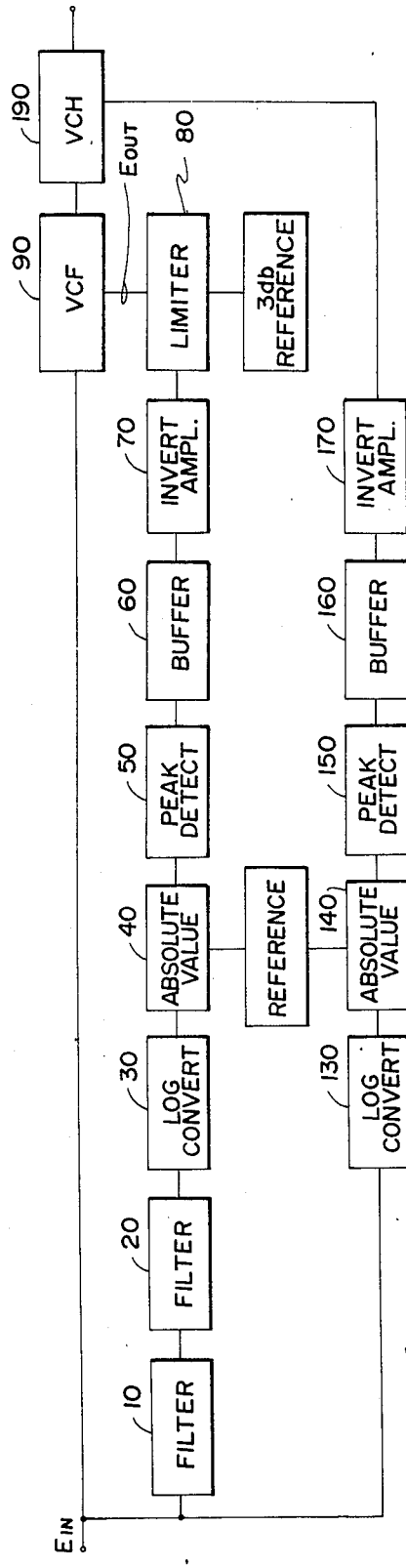
Fig. 3
Fig. 4

DYNAMIC NOISE REDUCTION WITH LOGARITHMIC CONTROL

BACKGROUND

This invention relates generally to non-complimentary or single-ended noise reduction systems and more particularly concerns non-complimentary noise reduction systems incorporating dynamically controlled filtering and low level expansion.

Dynamic filtering has been known and used for years in applications to reduce background noise present in audio signals. The basic principals of dynamic filtering were developed in the 1940's and remain the basis for the concepts of virtually all dynamic filter designs in use today.

One such design, for example, employs a low pass filter controlled from a detection circuit incorporating simple peak detection of the input signal. This design suffers from a limited range of accurate operation of the controllable filter.

Other designs exist in which dynamic filtering and low level expansion are combined to produce an improved noise reduction system. But these designs face another problem. One of the most important criteria for single-ended noise reduction systems utilizing in combination broad-band, low-level expansion and dynamically controlled low pass filtering is audible transparency. The low level expansion portion of a single-ended noise reduction system is only operational when signal levels drop below a threshold point. Therefore, in most applications and especially with composite music, the expansion portion of the system primarily operates only when signal levels are extremely low or in fade-in and fade-out portions of the music. But the dynamically controlled filter performs its function at nearly all times and continuously alters the band width of the system so as to reduce perceived noise in the audio signal. Thus the filter must also be extremely transparent at all times so as to avoid any loss of desirable audio information, such as would be the case if the filter were to close at low signal levels and reduce the band width so as to produce a noticeable loss of high frequency information.

In most known systems employing a dynamically controlled low pass filter, the control signal is produced in a substantially similar manner. The input signal is first high pass filtered so as to remove low frequency signals which are to have no effect on the dynamically controlled low pass filter. Thus, the filter control circuit is responsive only to the mid and high frequency portion of the audio band. This band-limited signal is then peak-detected or rectified and filtered so as to provide a substantially dc signal to control the dynamically controlled low pass filter. This method of producing the control signal results in an extremely limited range of response to the amplitude of the input signal. If the system is set up so that low signal levels will allow the filter to operate, normal and high amplitude input signals would obviously cause the filter to open to the end limit of the spectrum, therefore having no effective noise reduction provided at these normal and higher amplitude signals. Conversely, if the system is set up so that normal and high amplitude signals produce the desired effective response of the low pass filter, then low signal levels will cause the filter to remain closed, thereby reducing the high frequency content of the audio signal and producing an audible loss of high frequency audio information.

This problem was resolved in my U.S. Pat. No. 4,647,876, issued Mar. 3, 1987, by compressing the signal before presenting it to the dynamic filter control circuit. In that system, a 2 to 1 compression ratio was utilized compressing the dynamic range in half so that the dynamic filter would operate over twice its normal range of input level. The compressor operated in conjunction with a mis-tracking device to reduce the compression ratio at low signal levels. Without the mis-tracking device, a signal having a high degree of background noise would be compressed in some cases so that the amplitude of the noise floor could be of a sufficient magnitude so as to hold the dynamically controlled low pass filter open and not provide the desired amount of noise reduction. It is therefore apparent that the threshold control of that system affects both the threshold of expansion in the low level expansion circuit and the low level sensitivity of the dynamically controlled filter.

While that system overcame most limitations over the prior art systems, it still suffered from several problems. First, the compression system response characteristics for its attack and release times had to be optimized for the desired response of the composite low level expander, so as to avoid any perceived pumping in the operation of the low level expansion system. This response characteristic may not have been the desired response for the implementation of the dynamic filter control system. Second, further improvements could be made in the dynamic range of the dynamically controlled filter but, in that system, an increased compression ratio would be required, again complicating the design because the compressor and expander circuits operate conjunctively. Furthermore, while altering the compression and expansion ratio of that system could improve its dynamic range, a sacrifice of the transparency of the system might result. Third, that system does not lend itself to easy implementation of miniaturization of the circuit, such as hybrid circuit technology and large scale integration or LSI applications.

SUMMARY

The present invention provides a noise reduction system which has as an object the incorporation of detection systems with response controlled logarithmic conversion as an alternative to dynamic compression. A further object of the present invention is that it lends itself to easy implementation of hybrid circuit technology and LSI and further permits easy adjustments for various parameters of control. Yet another object is to provide a linear characteristic between the voltage controlled filter and the detection system. Finally, it is an object of the invention to allow for accurate simultaneous control of both the threshold of expansion and sensitivity of the dynamic filter, thereby allowing easy adjustment of the system for various reference levels.

In accordance with the invention, a dynamic filtering system with logarithmic control is provided in which the control signal is produced in response to input level and amplitude changes in a more linear fashion than is possible with dynamic compression. The control signal is applied to the control port of a voltage controlled low pass filter which also incorporates substantially linear control in volts-per decade of frequency. The attack response is program dependent so as to avoid the undesirable side effect of breathing.

BRIEF DESCRIPTION OF THE DRAWINGS

Other objects and advantages of the invention will become apparent upon reading the following detailed description and upon reference to the drawings in which:

FIG. 3 is a block diagram of an embodiment of the present invention using dynamically controlled low pass and high pass filtering and response controlled logarithmic conversion; and FIG. 4 is a block diagram of an embodiment of the invention employing dynamic filtering and low level expansion in conjunction with response controlled logarithmic conversion.

DETAILED DESCRIPTION

Figure 1:
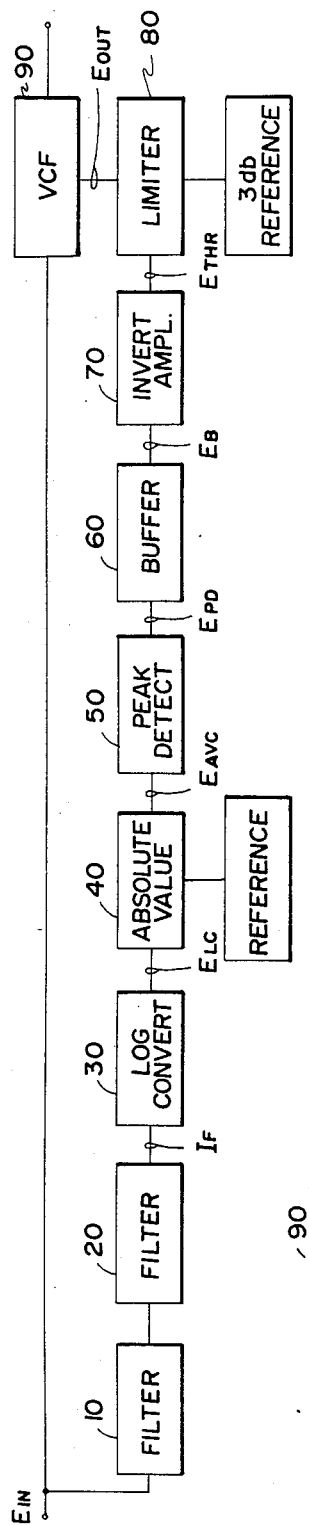
FIG. 1 is a block diagram of an embodiment of the present invention using dynamically controlled low pass filtering and response controlled logarithmic conversion.

As shown in FIG. 1, it may, for example, be desirable to filter an input signal $I_{in}$ in a voltage controlled filter 90. To do this, a variable filter control signal $E_{out}$ will be derived from the input signal $E_{in}$. The input signal $E_{in}$ is fed to a single pole 6 db per octave high pass filter circuit 10. The output of the first filter 10 is applied to a second single pole 6 db per octave high pass filter circuit 20. The composite output response of the two combined filters is therefore a 12 db per octave frequency response curve. This filtered signal is then applied to a log converter circuit 30 which substantially provides logarithmic compression of the filtered signal. The output of the log converter 30 is then full wave rectified in an absolute value circuit 40 which has an external control to allow adjustment of the low level sensitivity of the filtering system. The absolute value circuit 40 functions to derive a full wave rectified output of the filtered squared log converted input signal. The output signal of the circuit 40 is then peak detected and filtered by a processing circuit 50, fed to a buffer circuit 60 and then applied to a non-linear inverting amplifier circuit 70. The circuit 70 functions so as to provide a threshold point at which the voltage controlled filter becomes operational. The output of the inverting amplifier circuit 70 is then applied to an inverting limiter circuit 80 which effectively sets the upper end high frequency limit of operation for the voltage controlled filter 90 and also allows external adjustment for the quiescent low frequency −3 db point of the voltage controlled filter 90. The output $E_{out}$ from the circuit 80 is the dc control signal applied to the voltage controlled filter 90 to produce the desired response from that variable filter circuit.

Figure 2:
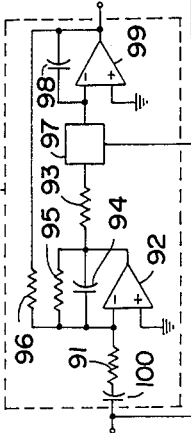
FIG. 2 is a schematic diagram of the embodiment of the present invention shown in block form in FIG. 1.
Figure 2:
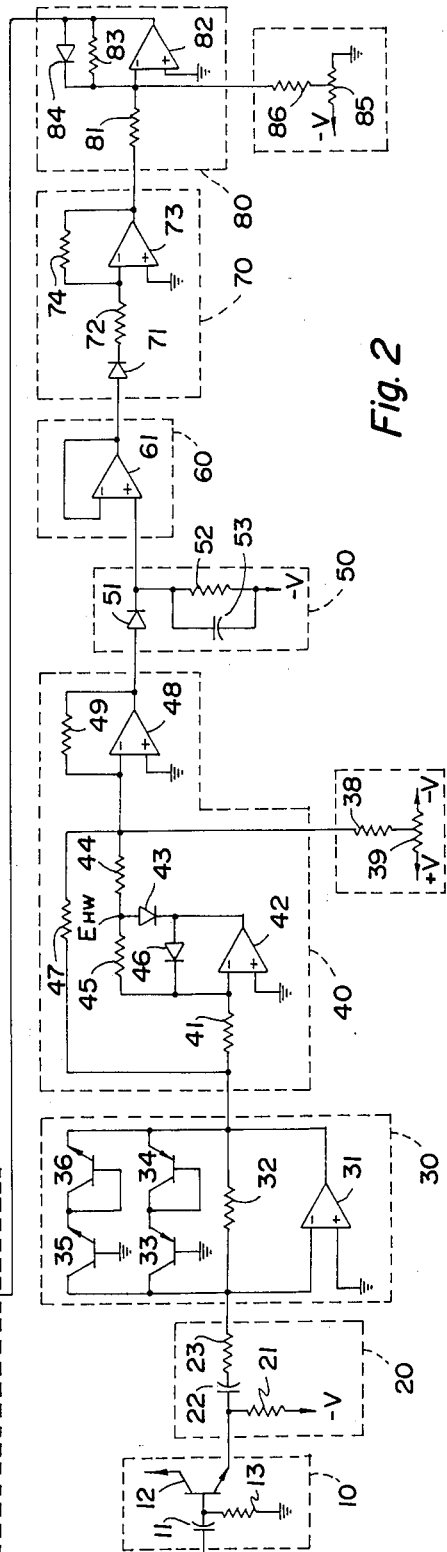

Turning to FIG. 2, the derivation of the dynamic filtering system control signal can be further understood. The input signal $E_{in}$ is applied to the detection circuit at the input of the high pass filter 10. A capacitor 11, connected to receive the input signal $E_{in}$, is connected at its other end to the base of a transistor 12 and to a resistor 13 which is connected to ground. The capacitor 11 and the resistor 13 form a single pole 6 db per octave high pass filter. The collector of the transistor 12 is tied to a positive voltage source and its emitter is connected through a resistor 21 to a negative voltage source. The transistor 12 acts as an impedance buffer so as to drive the filtered signal to a second high pass filter 20. The emitter of the transistor 12 is connected to a capacitor 22 which, with a series connected resistor 23, forms a second stage 6 db per octave high pass filter.

The output end of the resistor 23 is connected to the input end of the log convertor 30 at the summing point of an amplifier 31, which will appear as a virtual ground. Thus the resistor 23 operates as a part of the second high pass filter circuit 20 and also as an input voltage to a current converting resistor 32 in the logarithmic converter stage 30.

In the logarithmic converter circuit 30 the filtered signal $I_F$ is applied to an amplifier 31 which forms a bi-polar logarithmic converter producing an output $E_{LC}$ equivalent to two times the logarithm of the input current. The resistor 32 in the feedback loop of the amplifier 31 has one end connected to the output of the amplifier 31 and the other end connected to the inverting input of the amplifier 31. The non-inverting input of the amplifier 31 is tied to ground. The resistor 32 produces a deviation from the natural logarithm at low signal levels and serves to reduce the sensitivity of the control circuit at low signal levels.

The log converter 30 includes the high gain inverting amplifier 31 and a pair of oppositely conductive feedback paths. Two transistors 33 and 34 form a positive conductive path around the amplifier 31 and two other transistors 35 and 36 constitute a negative conductive path around the amplifier 31. The collectors of the transistors 33 and 35 are connected together and also to the inverting input of the amplifier 31. The bases of the transistors 33 and 35 are connected to ground. The second transistors 34 and 36 are diode connected transistors having their base and collectors tied together, and are connected respectively in series with the first transistors 33 and 35. The emitters of the first transistors 34 and 36 are connected together and to the output of the amplifier 31. It is a commonly known fact that the base-emitter voltage ($V_{BE}$) of a silicon transistor is logarithmically related to the collector current. Therefore, with two semiconductor junctions in each of the feedback paths around the amplifier 31, the output $E_{LC}$ will be directly proportional to two times the log of the filtered signal.

This log converted signal $E_{LC}$ is then applied to an absolute value circuit or full wave rectifier 40. In this circuit, an amplifier 42 operates as a half wave inverting rectifier producing an inverted half wave replica of the log converted signal $E_{LC}$. A diode 43 has its cathode connected to the output of the amplifier 42 and its anode connected between series connected resistors 44 and 45. The other end of the resistor 45 is connected to the summing node of the amplifier 42. Another diode 46 is connected in the feedback loop of the amplifier 42 having its anode connected to the output of amplifier 42 and its cathode to the summing point of amplifier 42. A resistor 41 is connected between the output $E_{LC}$ of the bi-polar converter stage 30 and the summing point of the amplifier 42. The resistors 41 and 45 are selected to be equal in value. With a positive signal at the output of stage 30, the output of the amplifier 42 is negative, thus closing the negative feedback loop through the resistor 45. At the junction of the resistors 44 and 45 and the anode of the diode 43, a half wave rectified signal $E_{HW}$ results.

A resistor 47 is connected between the output of the log converter circuit 30 and the inverting input of an amplifier 48. The amplifier 48 is an inverting summing amplifier having a resistor 49 connected in the feedback loop between its output and its inverting input. Both the amplifier 48 and the amplifier 42 have their non-inverting inputs tied to ground. The resistors 47 and 49 are selected to be equal in value to the resistors 41 and 45. The resistor 44 is selected to be half the value of the resistor 49. The resulting output of the amplifier 48 is a full wave rectified signal $E_{AVC}$.

A sensitivity adjustment may be applied to the non-inverting input of the amplifier 48, causing a dc current offset. This adjustment allows the dynamic filter sensitivity to be controlled by adjusting a variable resistor 39, which has a positive and negative voltage applied to its respective ends. A resistor 38 is connected between the inverting input of the amplifier 48 and the wiper of the variable resistor 39. It can be understood that the adjustment of the variable resistor 39 has the effect of adding an external control signal to the log converted signal. The output $E_{AVC}$ of the amplifier 48 is then peak detected and filtered. A rectifying diode 51 has its anode connected to the output $E_{AVC}$ of the absolute value circuit 40 and its cathode connected to a parallel connected capacitor 53 and resistor 52, the other ends of which are connected to a negative voltage source. The capacitor 53 will store a dc voltage equal to the peak voltage at the output of the amplifier 48. The resistor 52 will set the release time of the circuit.

The resulting dc voltage at the output $E_{PD}$ of the peak detector 50 is applied to the non-inverting input of a buffer amplifier 61. The amplifier 61 is tied to its inverting input forming a voltage follower. The output of the amplifier 61 generates an output signal $E_B$ corresponding to the logarithm of the RMS value of the filtered signal $I_F$ at stage 30, which has been scaled in volts-per decibels of input signal and dc offset by the variable resistor 39. This output $E_B$ deviates from the true RMS value of the filtered signal $I_F$ at low signal levels due to the effect of the resistor 32 in the feedback path of the amplifier 31. Increases in the input signal level will cause a positive increase in the dc level at the output $E_B$ of the amplifier 61.

The output $E_B$ of this buffer stage 60 is then applied to the input of a non-linear inverting amplifier stage 70. This stage 70 acts to set the threshold point at which the dynamic filter 90 will operate. The anode of a diode 71 is connected to the output $E_B$ of the amplifier 61 and its cathode is series connected through a resistor 72 to the inverting input of an amplifier 73. A resistor 74 is connected in the feedback loop of the amplifier 73 and the non-inverting input is tied to ground.

The output offset of the amplifier 48 could, for example, be adjusted such that a high frequency input level of −40 DBV would produce 0 VDC at the output $E_B$ of the buffer amplifier 61. Therefore it can be seen that signal levels below this level would produce no output $E_{THR}$ at the amplifier 73 because the dc output $E_B$ of the amplifier 61 would be negative with respect to the summing node of the inverting amplifier 73 (which is at ground potential) and the diode 71 would be reverse biased. The dc output $E_{THR}$ of the amplifier 73 would thus remain at ground or 0 VDC. High frequency signals present at the input above −40 DBV would produce a positive dc voltage at the output of the amplifier 61. Therefore the diode 71 would be in forward conduction and, because the amplifier 73 is an inverting amplifier, the dc output $E_{THR}$ voltage will be negative. It becomes apparent that the variable control 39 allows an extremely linear adjustment of the dynamic filter sensitivity because the detection system operates on a linear volt-per decibel basis. Understanding the operation of the inverting amplifier stage 70, it can be seen that this control allows easy adjustment of the system for various reference levels.

The output $E_{THR}$ of the inverting amplifier stage 70 is applied to an inverting limiter stage 80 through a resistor 81. The other end of the resister 81 is connected to the inverting input of an amplifier 82. Its non-inverting input is tied to ground. A resistor 83 and a diode 84 are parallel connected in the feedback loop of the amplifier 82. The anode of the diode 84 and one end of the resistor 83 are connected to the output of the amplifier 82. The cathode of the diode 84 and the other end of the resistor 83 are connected to the inverting input of the amplifier 82. The amplifier 82 operates to invert the dc signal at the output of the amplifier 73, to set the upper −3 DB point of the voltage controlled filter 90 by the use of the diode 84 and to allow adjustment of the low frequency quiescent −3 DB point of the voltage controlled filter 90 so as to allow control of the bandwidth of the operation of the voltage controlled filter 90. A variable resistor 85 is connected between a positive voltage source and ground. The wiper of the variable resistor 85 is connected through a resistor 86 to the inverting input of the amplifier 82 and adjusts the negative output offset of the amplifier 82, thereby adjusting the low frequency −3 DB point of the filter 90 in the absence of any mid or high frequency component present in the input signal. In certain designs, the variable resistor 85 could be omitted and the value of the resistor 86 selected to produce the desired output offset voltage. The attack response of the filter control circuit is program dependent so as to produce a desirable overall response of the operating system. That is, a signal such as a sudden high frequency or high level transient produces a much faster attack time than would a slight increase in frequency and/or amplitude. This understandably reduces the undesirable side-effect or breathing. It can be understood that in the absence of high frequency audio information to mask the high frequency noise component, a small level surge, if allowed to greatly increase the filter bandwidth (as is the case in prior art systems), will allow this high frequency noise to become audible and thereby produce a breathing effect. The release response of the control circuit is constant in volts-per unit of time and is determined by the value of the capacitor 53 and the resistor 52 in the peak detector 50.

The resulting output $E_{out}$ of the inverting limiter 80 is the dc control signal applied to the control port of the voltage controlled filter 90. It can be understood that the response characteristics of the filter control circuit may be optimized for the desired response to meet the requirement of transparent operation.

It should be noted in reference to FIG. 3 that the principals of the above embodiment can be conversely applied to provide a variable high pass filter 190 variably controlled by a filter control network 110-180 in which similar reference designations have been used to denote similar circuit operations.

There are a number of different voltage controlled filter circuits which will operate in the disclosed system with favorable results, but the voltage controlled filter circuit 90 produces excellent results for a number of reasons. The heart of the voltage controlled filter (VCF) shown is a high quality voltage controlled amplifier (VCA) with logarithmic control producing a linear volt-per decibel or "deci-linear" response. VCA's with this characteristic are commonly known. The filter shown is a version of a state variable filter and offers both high pass and low pass outputs from the amplifier 92 and the amplifier 99 respectively. The summing amplifier 92 compares the input signal with the low pass filter's output of the amplifier 99. The difference is the high pass output at the amplifier 92. This output could be used in the system shown in FIG. 3 to realize the voltage controlled high pass filter.

The input to the voltage controlled filter 90 is applied through a dc blocking capacitor 100 to a resistor 91 which is also connected to the inverting input of the amplifier 92. The non-inverting input of the amplifier 92 is connected to ground. A resistor 95 and a capacitor 94 are connected in the feedback loop of the amplifier 92. The output of the amplifier 92 is connected to a resistor 93, which is a voltage to current converting resistor, and connected to a VCA stage 97, which could be any high quality VCA presently available. The current output of the VCA 97 is connected to the voltage to current converting integrator 99 with a capacitor 98 in its feedback loop. The output of the integrator 99 is returned to the non-inverting input of the amplifier 92 by a resistor 96. In operation the VCA is used to vary the apparent value of resistor the 93, thereby changing the −3 DB frequencies of the filter outputs. The filter is configured such that increases above 0 VDC to the control port of the VCA will increase the −3 DB frequency to the filter output, and decreases in voltage below 0 VDC will cause a decrease in the −3 DB point of the filter output. The voltage controlled filter 90 shown produces a linear control function. That is, if the VCA were configured to have a 20 DB per volt gain control constant, a 1 volt change in control voltage would shift the −3 DB point of the filter by one decade in frequency. This linear volt-per decade response of the filter combined with the linear volt-per decibel characteristics of the detection circuit and the linear volt-per unit of time release rate of the detection circuit appear to improve the audible transparency of the system.

A noise reduction system incorporating both dynamic filtering and low level expansion is shown in FIG. 4, in which the circuitry in block form is similar to that already described such that similar reference designations have been used to denote similar circuit operations. In the circuit of FIG. 4, pumping of the expander circuit is virtually non-existent due to the fact that the VCA control circuit produces similar program dependent attack response to that of the voltage controlled filter detection circuit. Due to the fact that both circuits allow this linear control characteristic, a single threshold control may be used to simultaneously adjust both the threshold point of downward expansion and the sensitivity of the filter, thereby simplifying the design and allowing for easy adjustment of the various parameters of control. It can also be seen that this disclosed design lends itself much more easily to hybrid and LSI technology.

It will be apparent to those skilled in the art that many alternatives may be chosen and modifications made in the invention herein described without departing from the scope of the invention. All matters contained in this description or shown in the drawings is illustrative and not a limitation of the scope of the invention. Accordingly, it is intended that the scope of this invention includes all such alternatives and modifications as are apparent from the description or drawings or the appended claims.

What is claimed is:

1. A system for deriving a dc control signal from an input audio frequency signal comprising:
    means for filtering said input signal to reduce the level of said input signal when said signal falls within a preselected frequency range;
    means for compressing said filtered signal proportionately with respect to its logarithm;
    means for deriving from said compressed signal a signal proportional to the absolute value of said compressed signal;
    means for generating a reference signal of variably selectable level;
    means for combining said reference signal of variably selectable level with said absolute value signal;
    means for deriving a dc signal from said combined signal; and
    means for passing said derived dc signal when its level exceeds a preselected signal level and for blocking said derived dc signal when its level falls below said preselected signal level.

2. A system according to claim 1 further comprising means for passing said passed signal when its level falls below a second preselected signal level and for blocking said passed signal when its level exceeds said second preselected level.

3. A system for deriving a signal for controlling a dynamic filter from an input signal to said dynamic filter comprising:
    means for attenuating said input signal over a preselected range of low frequencies at a rate of 12 db per octave;
    means for compressing said attenuated signal to a level substantially equal to twice the logarithm of said attenuated signal;
    means for generating a signal of level substantially equal to the absolute value of said logarithmically compressed signal;
    means for generating a reference signal of variably selectable level;
    means for combining said absolute value signal with said reference signal;
    means for deriving a dc signal from said combined signal;
    means for inverting and passing said derived dc signal when its level exceeds a first preselected signal level and for blocking said derived signal when its level falls below said first preselected signal level; and
    means for inverting and passing said inverted passed signal when its level falls below a second preselected signal level and for blocking said inverted passed signal when its level exceeds said second preselected signal level.

4. A method of deriving a dc control signal from an input audio frequency signal comprising the steps of:
    attenuating said input signal over a preselected range of low frequencies;
    compressing said attenuated signal in proportion to its logarithm;
    converting said logarithmic signal to an absolute value signal;
    generating a reference signal of variably controllable level;
    combining said absolute value signal with said reference signal;

deriving a dc signal from said combined signal; and blocking said derived signal when its level falls below a preselected signal level.

5. A method according to claim 4 further comprising the step of blocking said derived signal when its level exceeds a preselected signal level.

6. A system according to claim 1 further comprising:

a second means for filtering said input signal to reduce the level of said input signal when said signal falls within a second preselected frequency range;

means for compressing said second filtered signal proportionately with respect to its logarithm;

means for deriving from said second compressed signal a signal proportional to the absolute value of said second compressed signal;

means for generating a second reference signal of variably selectable level;

means for combining said second reference signal of variably selectable level with said second absolute value signal;

means for deriving a second dc signal from said second combined signal; and means for passing said second derived dc signal when its level exceeds a predetermined signal level and for blocking said second derived signal when its level falls below said predetermined signal level, said means for generating said first reference signal and said means for generating said second reference signal having a common means for simultaneous variation of their respective reference signal levels.

7. A system according to claim 1 further comprising:

means for compressing said input signal proportionately with respect to its logarithm to produce a second compressed signal;

means for deriving from said second compressed signal a signal proportional to the absolute value of said second compressed signal;

means for generating a second reference signal of variably selectable level;

means for combining said second reference signal of variably selectable level with said second absolute value signal;

means for deriving a second dc signal from said second combined signal; and means for passing said second derived dc signal when its level exceeds a predetermined signal level and for blocking said second derived signal when its level falls below said predetermined signal level, said means for generating said first reference signal and said means for generating said second reference signal having a common means for simultaneous variation of their respective reference signal levels.

* * * * *